(12) United States Patent
Tsai

(10) Patent No.: US 6,503,118 B2
(45) Date of Patent: Jan. 7, 2003

(54) MULTI-FUNCTIONAL VACUUM PROCESSING APPARATUS

(76) Inventor: Yuan Lin Tsai, Fl. 7-1, No. 93 Rosevelt Road, Sec. 2, Taipei (TW)

(*) Notice: Subject to any disclaimer, the term of this patent is extended or adjusted under 35 U.S.C. 154(b) by 43 days.

(21) Appl. No.: 09/837,258

(22) Filed: Apr. 19, 2001

(65) Prior Publication Data

US 2002/0187715 A1 Dec. 12, 2002

(51) Int. Cl.⁷ .................................................. H01J 9/38
(52) U.S. Cl. ......................................... 445/70; 445/73
(58) Field of Search ..................................... 445/70, 73

(56) References Cited

U.S. PATENT DOCUMENTS 3,698,050 A * 10/1972 Rubin .......................... 29/475
3,796,475 A * 3/1974 Yamamoto et al. ........... 316/27
5,496,201 A * 3/1996 Hwang ........................ 445/73

* cited by examiner

Primary Examiner—P. Austin Bradley
Assistant Examiner—Briggitte Hammond
(74) Attorney, Agent, or Firm—Rosenberg, Klein & Lee

(57) ABSTRACT

A multi-functional vacuum processing apparatus for luminous tubes (especially for neon tubes), glass containers, food containers, and cosmetic containers, generally includes a body fame, a vacuum pump, a main pipe, a plurality of valves, a plurality of gas tanks, a thermometer, an adjustable current controller and high voltage transformer, a turbine vacuum pump, a turbine controller, an inspector, safety sensors, and a control panel, whereby one whereby one can carry out vacuum processing procedures with fully or semi-automatic operations so that no skilful operators are required and ordinary operators can increase quality, working efficiency, service life and production rate, and decrease costs, and can provide protection, safety, troubleshooting and inspection functions.

17 Claims, 15 Drawing Sheets

MULTI-FUNCTIONAL VACUUM PROCESSING APPARATUS

BACKGROUND OF THE INVENTION

1. Field of the Invention

This invention is related to a multi-functional vacuum processing apparatus and in particular to one which enables ordinary operators to carry out vacuum processing with fully or semi-automatic operation, thereby improving the vacuum processing quality of products and increasing the production rate. Further, the multi-functional vacuum processing apparatus can provide protection, safety, troubleshoot and inspection functions.

2. Description of the Prior Art

Although neon lights have been invented for more than 100 years, the production method has not changed, and has not been improved upon. Their application ranges from the neon signs on the wall to the neon advertisement on the top of a building, to outdoor neon advertisement signs to the indoor neon hanging lights and some architecture with neon light decorations on the outside of the building. Neon lights play an important role in daily life, and in architecture.

Except for the material for making neon lights, the production and quality of neon lights have not changed a lot. There has been little change in the apparatus for the manufacture of neon lights. The conventional method of manufacturing can only produce straight neon lights, and some manufacturers use this automatic bending equipment to produce curved and circular neon lights. The conventional way to bend the neon lights is finished by manual operation.

The conventional vacuum processing apparatus is shown in FIG. 13. As shown, the vacuum processing apparatus includes a vacuum pump 1 and exhaust pipe 11, an argon pipe 21, a neon pipe 31, and a blowing pipe 41.

The pipes 11, 21, 31 and 41 are controlled by valves 12, 22, 32 and 42 (see FIGS. 14 and 15). A mercury meter 5 for measuring vacuum degree is connected between the two valves 32 and 42. The main pipe 43 is extended from the blowing pipe 41 and the main pipe is connected with two branch pipes 431, which are each connected with a neon light 6. The exhaust pipe 11 is connected to the vacuum pump 1. The argon pipe 21 is connected with an argon tank. The neon pipe 31 is connected with a neon tank 3. The blowing pipe 41 is connected with a flexible pipe so that an operator can blow air through the flexible pipe into the neon lights 6 via the branch pipes 431. This is to prevent the neon lights 6 from being broken A vacuum degree is represented by tort:

| Low vacuum | 760~1 | torr |
| Medium vacuum | $10^{-1} \sim 10^{-2}$ | torr |
| High vacuum | $10^{-3} \sim 10^{-5}$ | torr |
| Superhigh vacuum | below $10^{-7}$ | torr |

The vacuum degree obtained by the conventional vacuum processing apparatus can only reach $10^{-2}$ torr. The vacuum degree is important to the service life and the illumination intensity of neon lights. Therefore the manufacturers have tried to improve the production equipment to obtain a high vacuum degree in order to obtain high quality products. One of the commonly used methods is using a diffusing pump, which is heated by silicon oil to produce silicon molecules. The silicon molecules will evaporate when heated, and will feed back when cooled. The diffusing pump uses this kind of feedback power to increase vacuum degree to a measure of $10^{-3}$ torr.

On the other hand, some manufacturers replace the conventional valve with solenoid valves, in association with an automatic operation system, in order to improve the manufacture of neon lights. But these kind of improvements do not have any influence on the vacuum degree.

From the above, it can be seen that although there is some improvement in the neon light production equipment, there has been no technical breakthrough in the increase of vacuum degree. Therefore the conventional neon light production equipment is not ideal in operation and suffers from the following drawbacks:

(1) It cannot provide fully automatic and semi-automatic functions, so that the setting and control of the equipment rely on the experience of the operators. Hence, quality and service life of the neon light depends on the technical knowledge of the operators, so that it is difficult to lower the defect rate of products, costs and the personal operation fee costs. Furthermore, an operator can only control production equipment—the manufacture, production and efficiency cannot be effectively increased.

(2) As such production equipment is not designed for various processing procedures, the quality, service life and illumination intensity of the neon lights are not ideal.

(3) Such equipment cannot measure the temperature of neon lights and cannot sense whether the temperature sensing claim is mounted correctly.

(4) The heating temperature produced by the transformer is fixed and not variable. As to the small (such as a diameter of 5 mm) or larger thin neon light with a diameter of 5 mm or large neon light with a diameter of 18 mm–25 mm, so that the thin neon light cannot be manufacture with this equipment because the thin neon light will melt at high temperature and the impurities with the large neon light cannot be effectively decomposed into molecules at low temperature. Although some equipment have variable micro ampere meter to adjust the heating temperature, the adjustment is operated by a steering wheel, which is bulky in volume and inconvenient to operate.

(5) Such equipment can only detect large leakage. If the leakage is small, it cannot be immediately sensed. It often takes a few days to detect the leakage, thereby influencing the vacuum degree.

(6) Such equipment does not have safety means and a high voltage transformer is exposed, so that the people who are close to it will be in danger.

(7) Such equipment cannot show the operation and production times so that the operator will often forget to maintain the equipment (8) The water vapor produced by such equipment is generally drained off by opening a cover, thereby making it inconvenient to operate.

(9) Such equipment does not have waste collectors on the exhaust pipe, so that when the neon light is vacuumed, the impurities and shards of glass will be sucked into the neon light, causing damage.

Therefore, it is an object of the present invention to provide a multi-functional vacuum processing apparatus which can obviate and mitigate the above-mentioned drawbacks.

SUMMARY OF THE INVENTION

It is the primary object of the present invention to provide a multi-functional vacuum processing apparatus for manufacturing neon tubes, glass containers, food containers and cosmetic containers, which includes a rectangular body frame for receiving primary components, said body frame having a control panel on which are mounted relevant control members, indicators, setting members . . . etc., a platform extending from a rear portion of said body frame for placing workpieces to be processed, a transformer having an output electrode line extending through said body frame to be connected in series with a workpiece to be processed, a vacuum pump having an exhaust pipe which is connected at the intermediate portion and an end thereof with normal open valve and normal closed valve, a turbine vacuum pump connected with two exhaust pipes having an end connected with exhaust pipes connected with the front and rear sides of the normal open valve, said two exhaust pipes each having a normal closed valve, a main pipe having an end connected with a normal closed valve and an intermediate portion connected with an argon pipe, a helium pipe, a neon pipe, a sensor pipe, a vacuum meter pipe and a blowing pipe and having branch pipes at another end connected with a workpiece to be processed, gas tanks including an argon tank, a helium gas and neon tank which are connected with pressure gauges, pneumatic valves, gas micro-adjustable valves and switches which are in turn connected to pipes, a vacuum degree meter having two hot cathode vacuum sensors and a cold cathode vacuum sensor, a turbine controller connected with said vacuum degree meter and said turbine vacuum pump, a thermometer for measuring temperature of a workpiece to be processed, a high voltage transformer and an adjustable current controller, wherein said transformer produces voltage at an output end from which an electrical wire extends out, said current controller utilizing a knob and a timer to adjust current and set output time, and an air compressor arranged within said body frame.

It is another object of the present invention to provide a multi-functional vacuum processing apparatus and in particular to one which enables one to carry out vacuum processing procedures with fully or semi-automatic operations as desired.

It is still another object of the present invention to provide a multi-functional vacuum processing apparatus which can improve the quality and prolong the service life of neon tubes.

It is still another object of the present invention to provide a multi-functional vacuum processing apparatus which can inspect whether the temperature sensor clamp has been mounted on the neon tube or not and whether there is leakage.

It still another object of the present invention to provide a multi-functional vacuum processing apparatus which can process neon tubes with various diameters from 5 mm to 25 mm.

It is still another object of the present invention to provide a multi-functional vacuum processing apparatus which has safety sensors for ensuring the safety of anyone close to the apparatus.

It is still another object of the present invention to provide a multi-functional vacuum processing apparatus which utilizes a counter to remind the operator to carry out maintenance.

It is still another object of the present invention to provide a multi-functional vacuum processing apparatus which has a drain valve to let off the water from the air compressor.

It is a further object of the present invention to provide a multi-functional vacuum processing apparatus which can prevent impurities from entering into the neon tube.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

Figure 1:
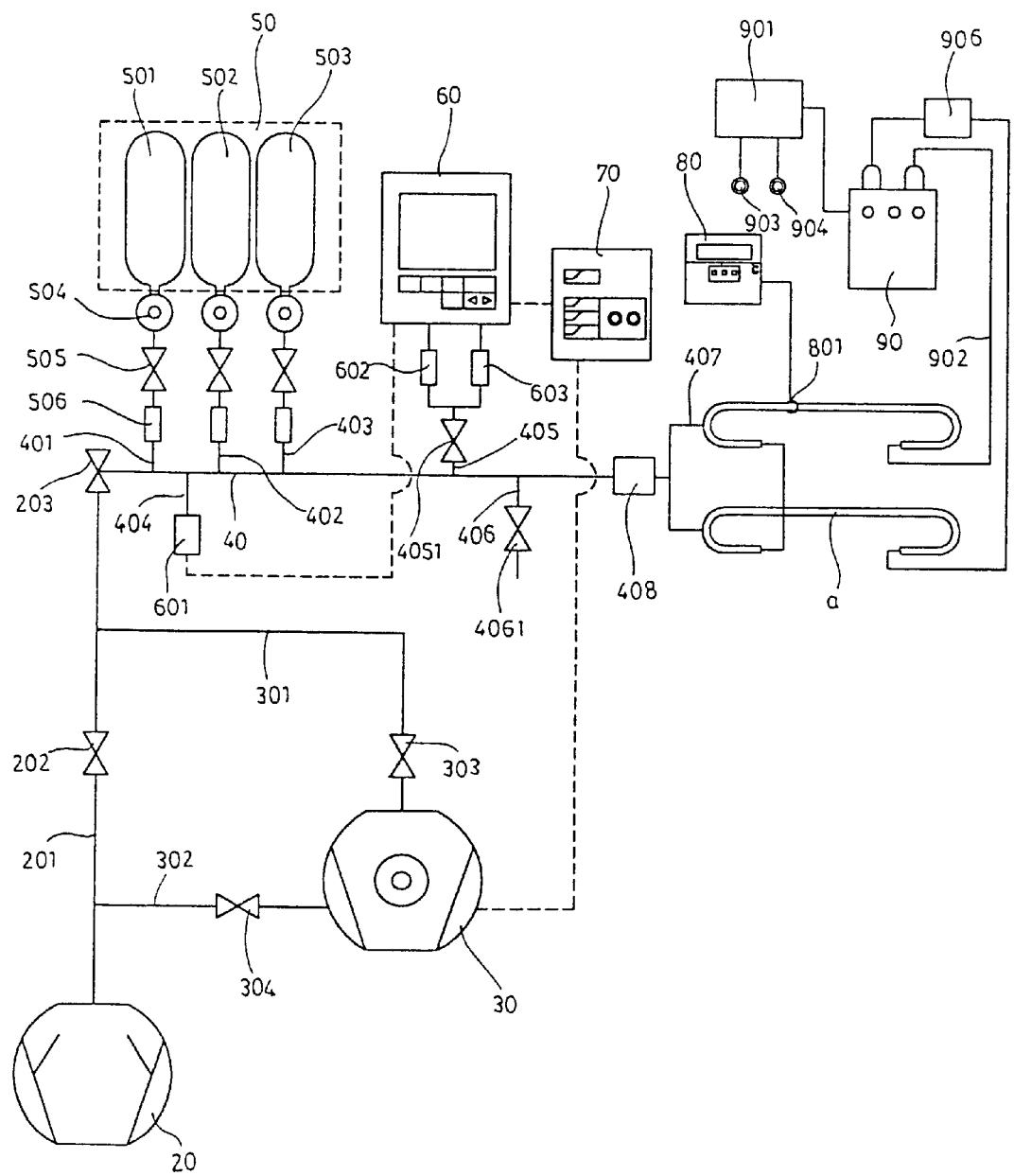
FIG. 1 illustrates the internal structure of the present invention.
Figure 2:
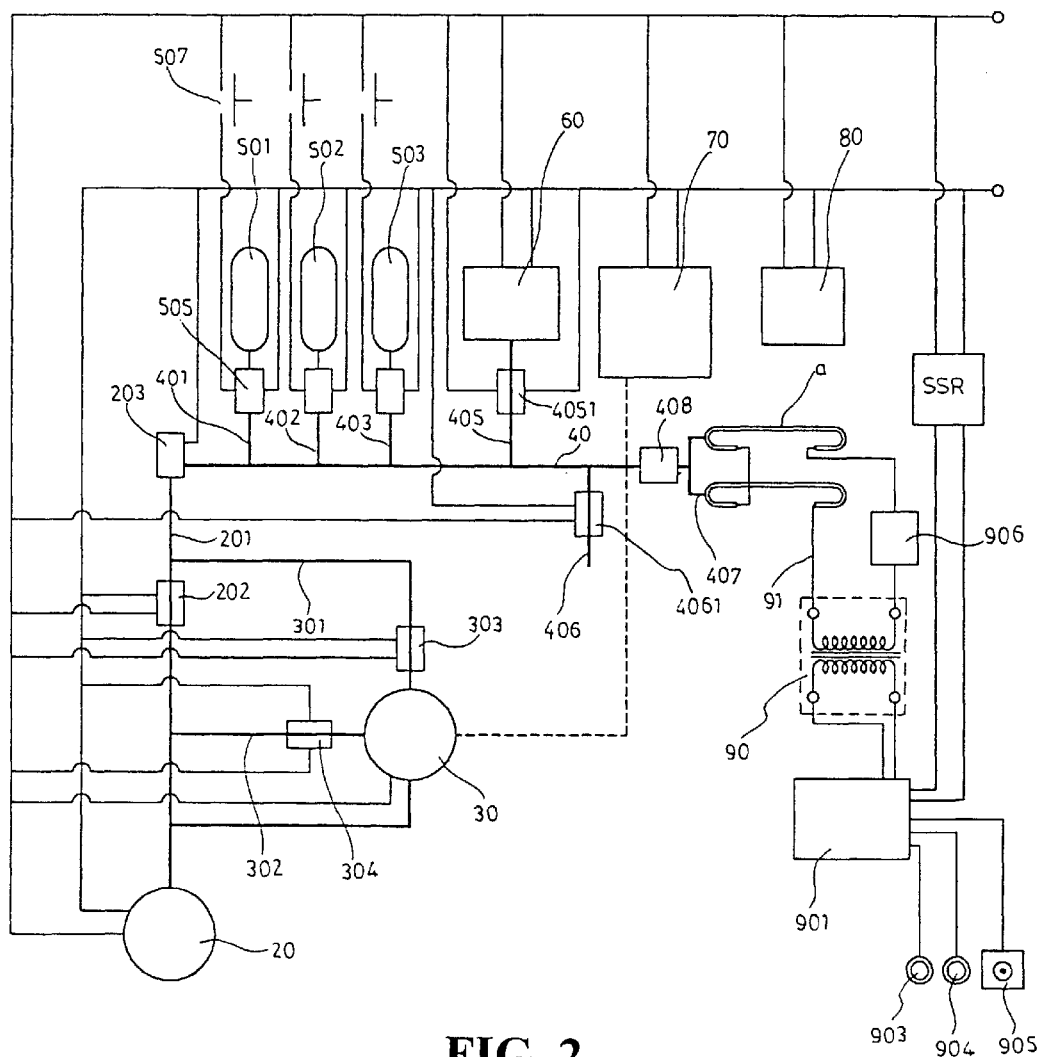
FIG. 2 is a circuit diagram of the present invention.
Figure 3:
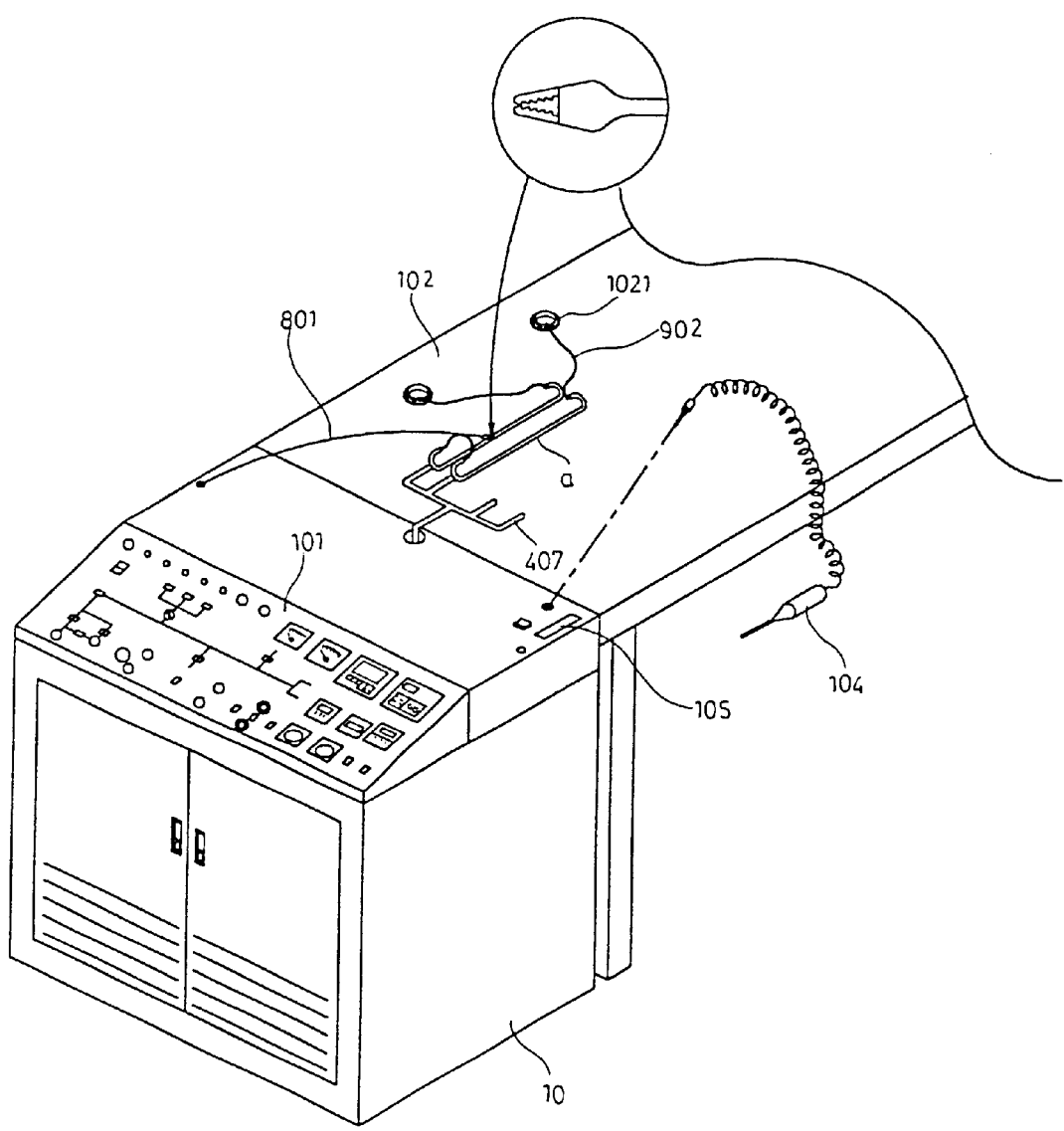
FIG. 3 is a perspective view of the present invention.
Figure 4:
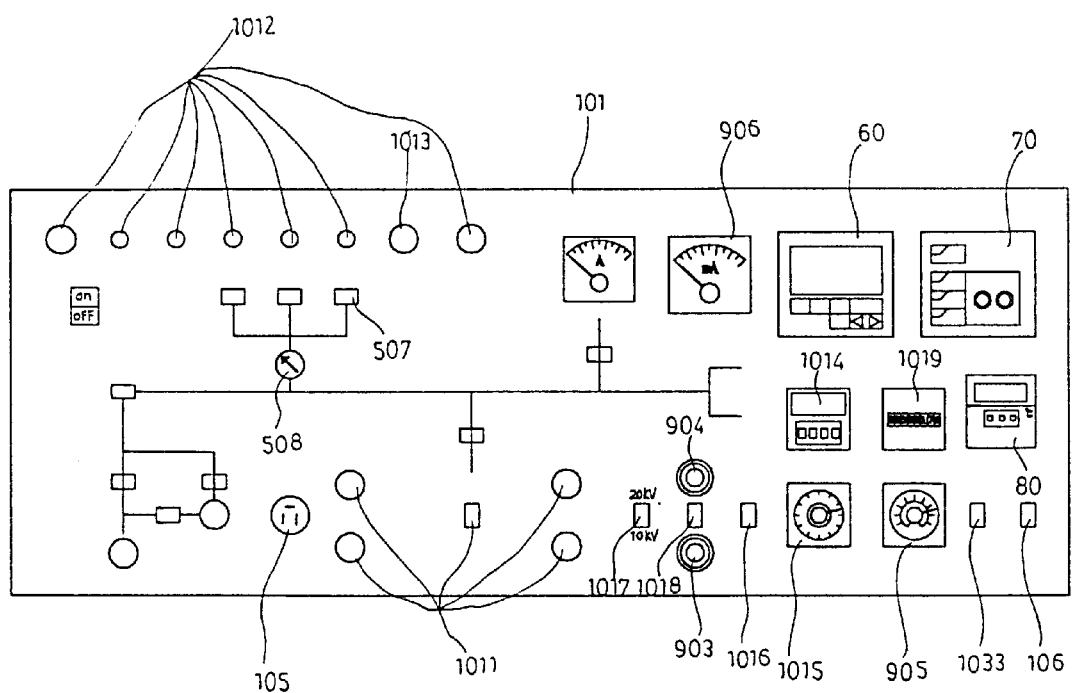
FIG. 4 is an enlarged top view of the control panel.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, alterations and further modifications in the illustrated device, and further applications of the principles of the invention as illustrated herein being contemplated as would normally occur to one skilled in the art to which the invention relates.

Referring to FIGS. 1, 2, 3 and 4, the present invention generally comprises a body frame 10, a vacuum pump 20, a turbine vacuum pump 30, a main pipe 40, gas tanks 50, a vacuum degree meter 60, a turbine controller 70, a thermometer 80, a high voltage transformer 90, an adjustable current controller 901, and an air compressor 103.

The body frame 10 is a rectangular box for receiving primary component parts such as the compressor 103 and the high pressure transformer 90. The top of the body frame 10 has a detachable control panel 101 on which are mounted control members, indicators, setting members . . . etc. A platform 102 extends from the body frame 10 for placing neon tube (a) to be processed. The terminal line 902 of the transformer 90 is pulled out of the rear portion of the body frame 10 and protected and insulated by an insulation fixed connector 903. Then, the terminal line 902 extends through the platform 102 to connect with an end of the neon tube (a). A plurality of insulation members 1021 are provided on the platform 102 where the terminal line 902 goes through.

The vacuum pump 20 is connected with an exhaust pipe 201 having a normal open valve 202 and a normal closed valve 203 for drafting air and impurities from the neon tube (a).

The turbine vacuum pump 30 has two exhaust pipes 301 and 302 which are connected with the normal open valve 202 via two exhaust pipes 201 for balancing pressure and increase vacuum degree. The two pipes 301 and 302 are connected with two normal closed valves 303 and 304 respectively.

Figure 10:
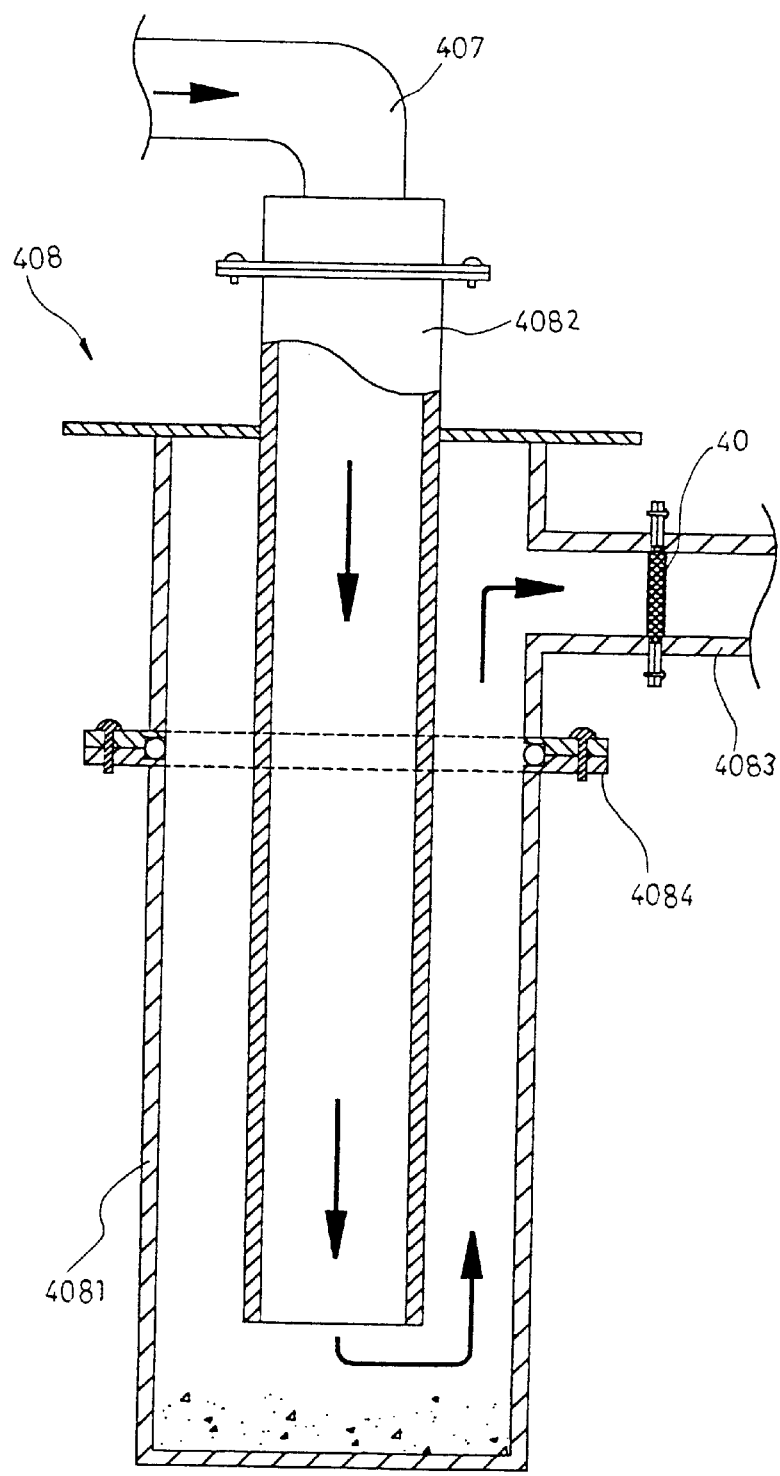
FIG. 10 illustrates the structure of the trash collector.

The main pipe 40 is connected with the normal closed valve 203 at an end, with an argon pipe 401, a helium pipe 402, a neon pipe 403, a sense pipe 404, a vacuum meter pipe 405, and a blowing pipe 406 at the intermediate portion, and with a trash collector 408 at the other end. The trash collector 408 is in turn connected with two branch pipes 407 connected with the neon tube (a) for drafting and filling air. Referring to FIG. 10, the trash collector 408 includes a large container 4081 and a small container 4082 having an end inserted into the large container 4081 and another end connected with the a connecting pipe 407. The large container 4081 is closed and connected with the main pipe 40 at one side and a filter 4083 is provided at the connection, so that when the neon tube (a) is vacuumed, the impurities and shredded glass will drop down into the bottom of the large container 4081 and separated by the filter 4083 thereby preventing the damage of relevant component parts. The large container 4081 is provided with a clamp 4084 so that the large container 4081 can be opened for cleaning by releasing the clamp 4084.

The gas tanks 50 refer to the argon tank 501, helium tank 502 and the neon tank 503 which are connected with pipes 401, 402 and 403 via a pressure gauge 504, a pneumatic valve 505, a gas micro-adjustable valve 506 and a switch 507.

The vacuum meter 60 is connected two hot cathode vacuum sensors 601 and 602 and a cold cathode vacuum sensor 603. The vacuum sensor 601 is connected with a sensor pipe 404, while the vacuum sensors 602 and 603 are connected in parallel and then connected in series with a vacuum meter control valve 4051 and a vacuum member pipe 405.

The turbine controller 70 is connected with the vacuum meter 60 and the turbine vacuum pump 30 for determining the reading of the vacuum meter 60 thereby controlling the opening and closing of the turbine vacuum pump 30.

The thermometer 80 utilizes a temperature sensor clamp 801 passing through the body frame 10 to measure the temperature of the neon tube (a).

The high temperature transformer 90 converts an input of 220V into 10 KV, 20 KV which are connected to a terminal line 902. The current controller 901 utilizes two rotating knobs 903 and 904 and a timer 905 to adjust the current and to set the output time. The current is shown in a current meter 906 on the panel 101. By means of the terminal line 902, different heating temperatures can be applied to neon tubes of various diameter.

Figure 7:
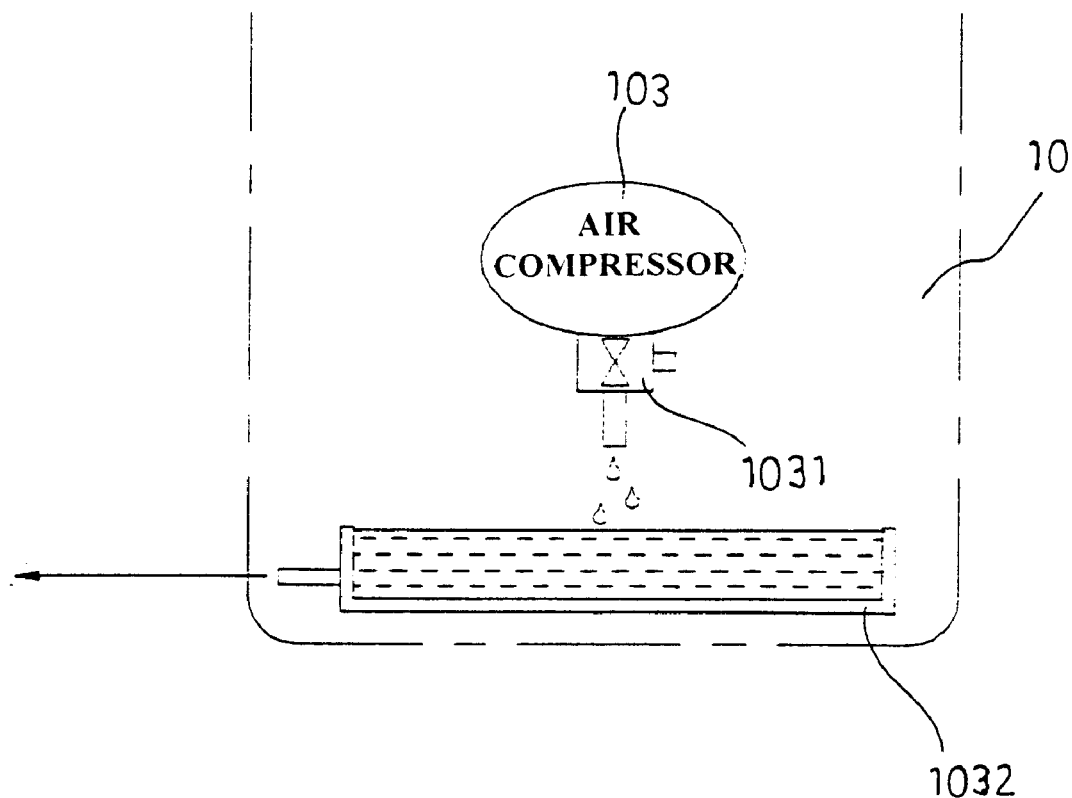
FIG. 7 illustrates the structure of the draining device for the compressor.
Figure 8:
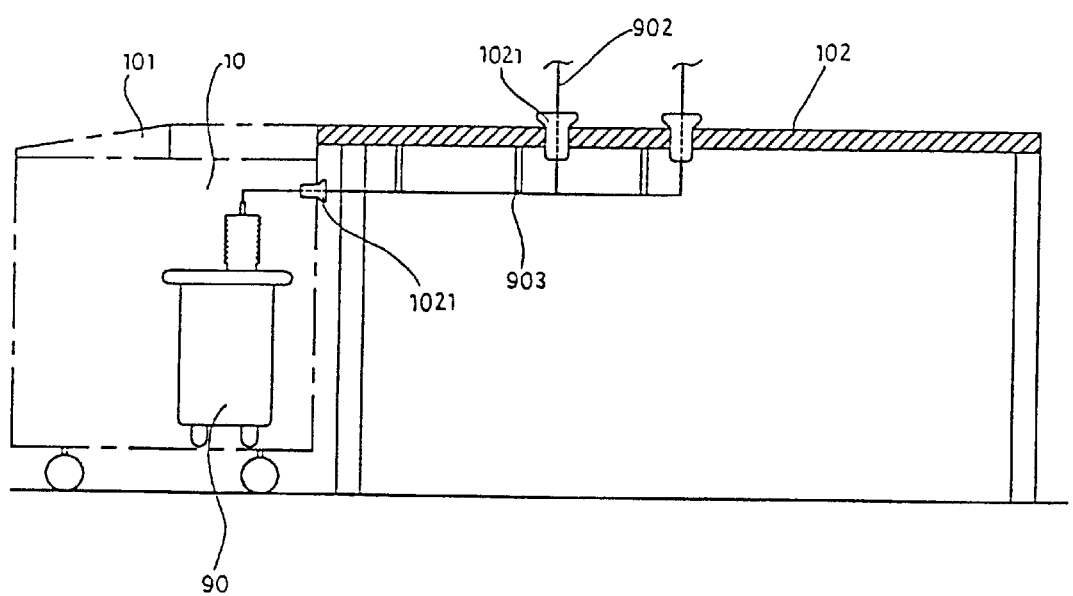
FIG. 8 illustrates the arrangement of the high voltage terminal line.

The air compressor 103 (see FIG. 7) is provided at the bottom with a draining valve 1031 under which there is a tray 1032, so that when the drain switch 1033 on the panel 10 is depressed, the drain valve 1031 of air compressor will be opened to let off the water from the gas tank and the water will be collected by the tray 1032.

Figure 5:
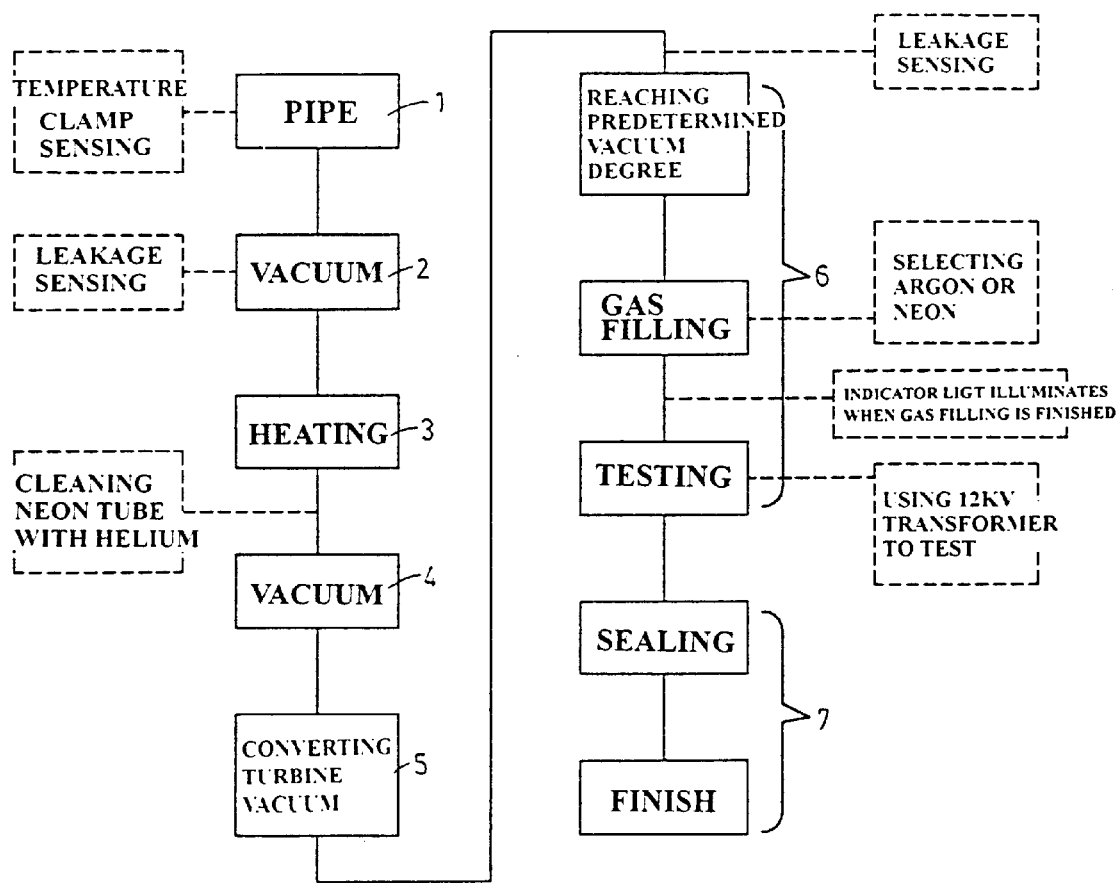
FIG. 5 is a flow chart of the present invention.

By means of the above-mentioned apparatus, a vacuum with $10^{-5}$ torr can be obtained. Referring to FIG. 5, the present invention can be carried out by fully or semi-automatic operations, and by means of the control switches 1011 on the panel 101, the temperature sensor clip 801 and the high voltage terminal line 902 can be attached to the neon tube (a) before operation. The working procedures of the present invention will now be described as follows:

STEP 1: CONNECTION: The neon tube (a) is first connected with the pipe 407 by heating and in the meantime, air is blown into the pipe 406 and the blowing valve 4061 is opened to provide a passage. The air will then enter into the neon tube (a) through the pipe 407 to prevent the blockage of the neon tube during processing. If the temperature sensor clip 801 is forgot to mount in an appropriate position, an indicator light 1012 on the panel 101 will be turned on and a buzzer 1013 will send out warnings. This is an inspection function and the temperature sensing procedure can be replaced with non-contact type ultra-red temperature sensor instruments.

STEP 2: VACUUMING: When the control switch 1011 for fully automatic operations is depressed, the normal closed valve 203 of the pipe 201 will be opened and the blowing valve 4061 will be closed for vacuuming air. If the hot cathode vacuum sensor 601 does not reach the predetermined value of 1 mm–2 mm within the predetermined time, the leakage is serious and the serious leakage indicator light will be turned on and the buzzer 1013 will send out warnings.

STEP 3: HEATING: When the hot cathode vacuum sensor 601 reaches the predetermined value of 1 mm–2 mm, the high voltage transformer 90 will output current to keep on heating the electrode and the neon tube. Meantime, the normal closed valve 203 will be closed and the air molecules and attached molecules within the neon tube (a) will be isolated by the increase of the temperature.

STEP 4: VACUUMING: When the molecules isolated from the neon tube (a) exceed the predetermined value of 1 mm–2 mm, the high voltage transformer 90 will stop outputting current and the normal closed valve 203 will be opened and the step 2 will be repeated. As the conditions mentioned in step 2 are reached, the step 3 is repeated until the temperature measured by the thermometer 80 reaches 250° C., the power supplied to the high voltage transformer 20 will be cut off, the normal closed valve 203 will be opened, and the helium valve 505 will be opened to let off helium to remove the impurities in the neon tube (a).

Figure 6:
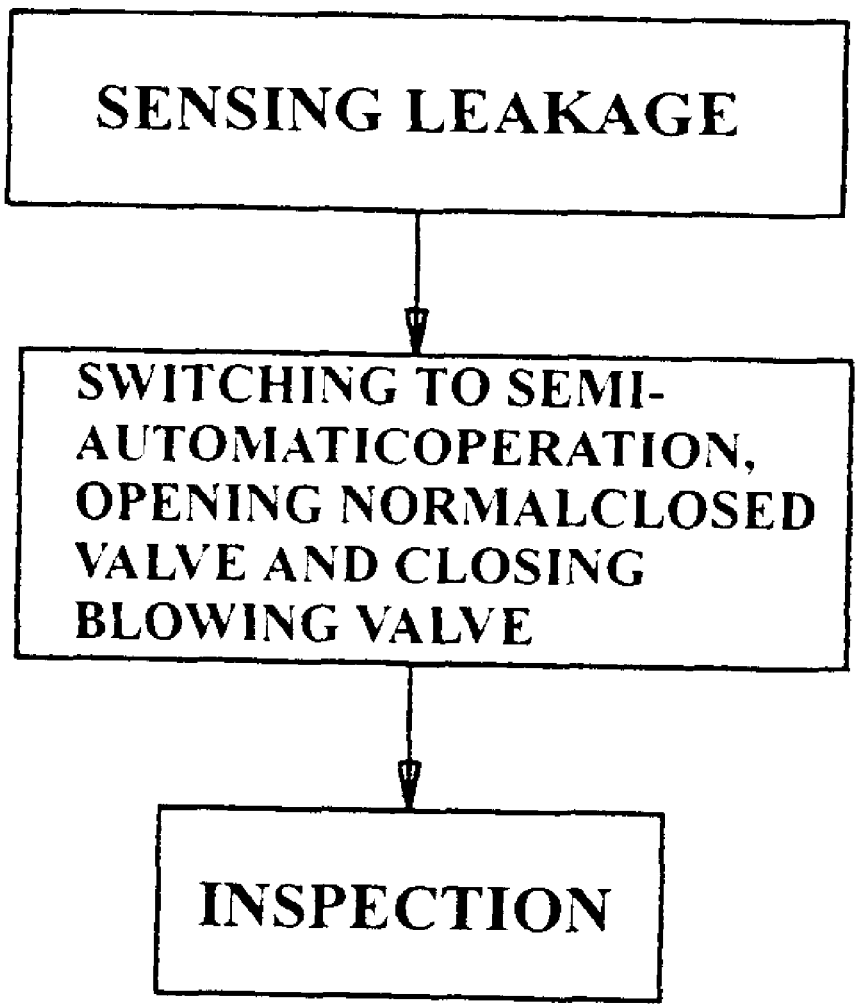
FIG. 6 is a flow chart of the leakage sensing inspection.

STEP 5: CONVERTING TURBINE VACUUM PUMP: After cleaning, the normal closed valve 203 and the vacuum meter control valve 4051 is opened. Then, the hot cathode vacuum sensor 602 uses its first predetermined value of $7 \times 10^{-2}$ torr to sensor the vacuum degree, if the predetermined value is reached, the normal closed valves 303 and 304 will be opened. That is, the turbine vacuum pump 30 is first vacuumed to balance the pressure difference between the vacuum pump 20 and the turbine vacuum pump 30. When the hot cathode vacuum sensor 602 reaches its second predetermined value of $3\times10^{-2}$ torr, the normal open valve 202 is closed, the turbine vacuum pump 30 is turned on and the cold cathode vacuum sensor 603 begins to sense. If it does not reach the predetermined value of $2\times10^{-4}$ torr, there must be small leakage. Meantime, the indicator light 1012 for small leakage will be turned on and the buzzer 1013 will send out long siren. The serious and small leakage can be detected by the detector 104 extended out of the body frame 10 (see FIG. 6). In case of leakage, the normal closed valve 203 is first opened and the blowing valve 4061 will be closed to reach the vacuuming condition (semi-automatic operation is carried out at this time). Then, the detector 104 is used for sensing the connection of he neon tube (a) to detect whether there is abnormal discharging condition.

Figure 9:
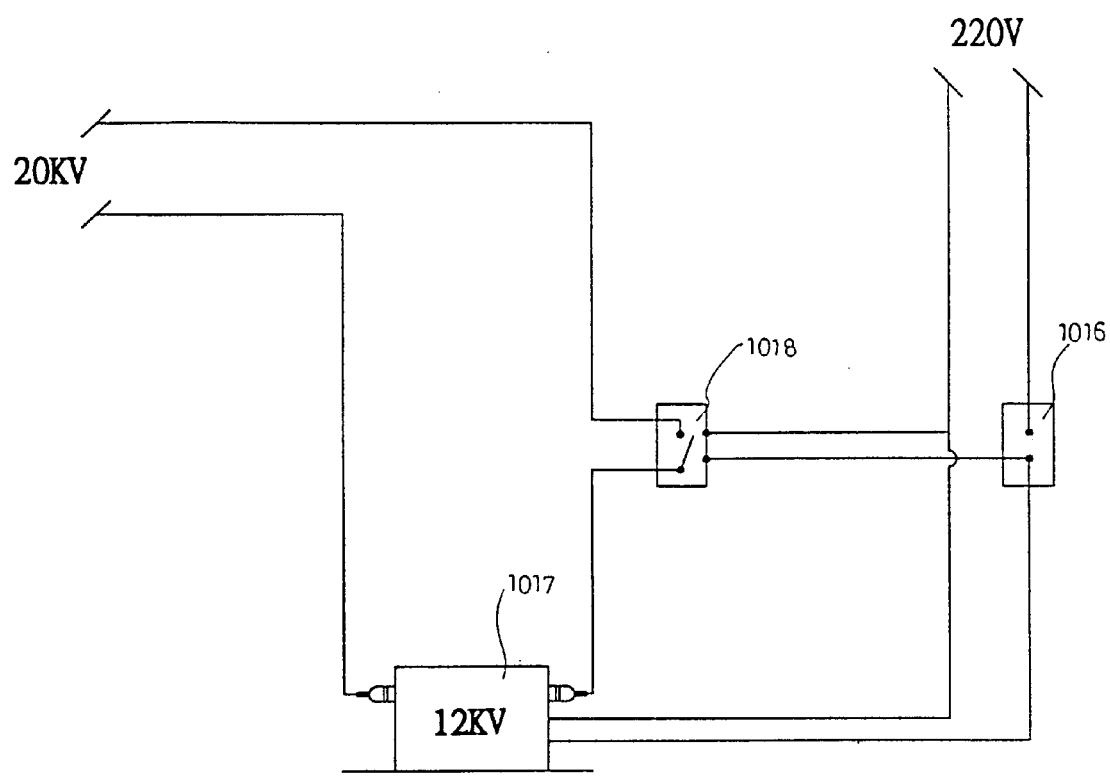
FIG. 9 is a circuit diagram of the testing light.

STEP 6: FILLING: When the turbine vacuum pump 30 is turned on, the vacuum pressure will be increased to reach the predetermined value of $2\times10^{-4}$ torr of the cold cathode vacuum sensor 603. Meantime, the normal closed valve 203 will be closed. The gas filled into the neon tube can be selected by turning the knob 508 so that the arrow of the knob 508 is aligned with the switch 507 of the argon tank 501 or neon tank 502, thereby opening the pneumatic valve 505 to fill the desired gas into the neon tube (a). When a predetermined amount of the gas has been filled into the neon tube (a) (the present invention uses a timer 1015 to limit the time for filling the gas), the indicator light 1021 will be turned on. The counter 1014 will begin to count and when the production time reaches a predetermined value, the counter will remind the operator of the maintenance of the vacuum pump 20. The vacuum pump 20 has a handle for operation. After gas filling, the test indicator light switch 1016 on the panel 101 is depressed to perform the current test for the neon tube (a). The test indicator light switch 10 is connected with a testing structure (see FIG. 9) which has a transformer 1017 of 12 kv which is connected in parallel with the electrode line 902 of 20 kv. Since the vacuum heating operation is connected with a wire of 20 kv, it is necessary to change it with a wire of 12 kv to test. The conventional equipment is directly connected in parallel with a wire of 20 kv, so that in case of abnormal condition, the 12 kv transformer will be burnt down. The transformer 1017 is provided with a relay 1018 for cutting high voltage and can be used for testing.

STEP 7: SEALING: When the indicator light is turned after gas filling, the vacuum gas filling operation is finished. Then, the neon tube (a) is sealed to produce the finish product.

The semi-automatic operation is generally used in replacing gas tanks or detecting whether there is leakage.

Figure 11:
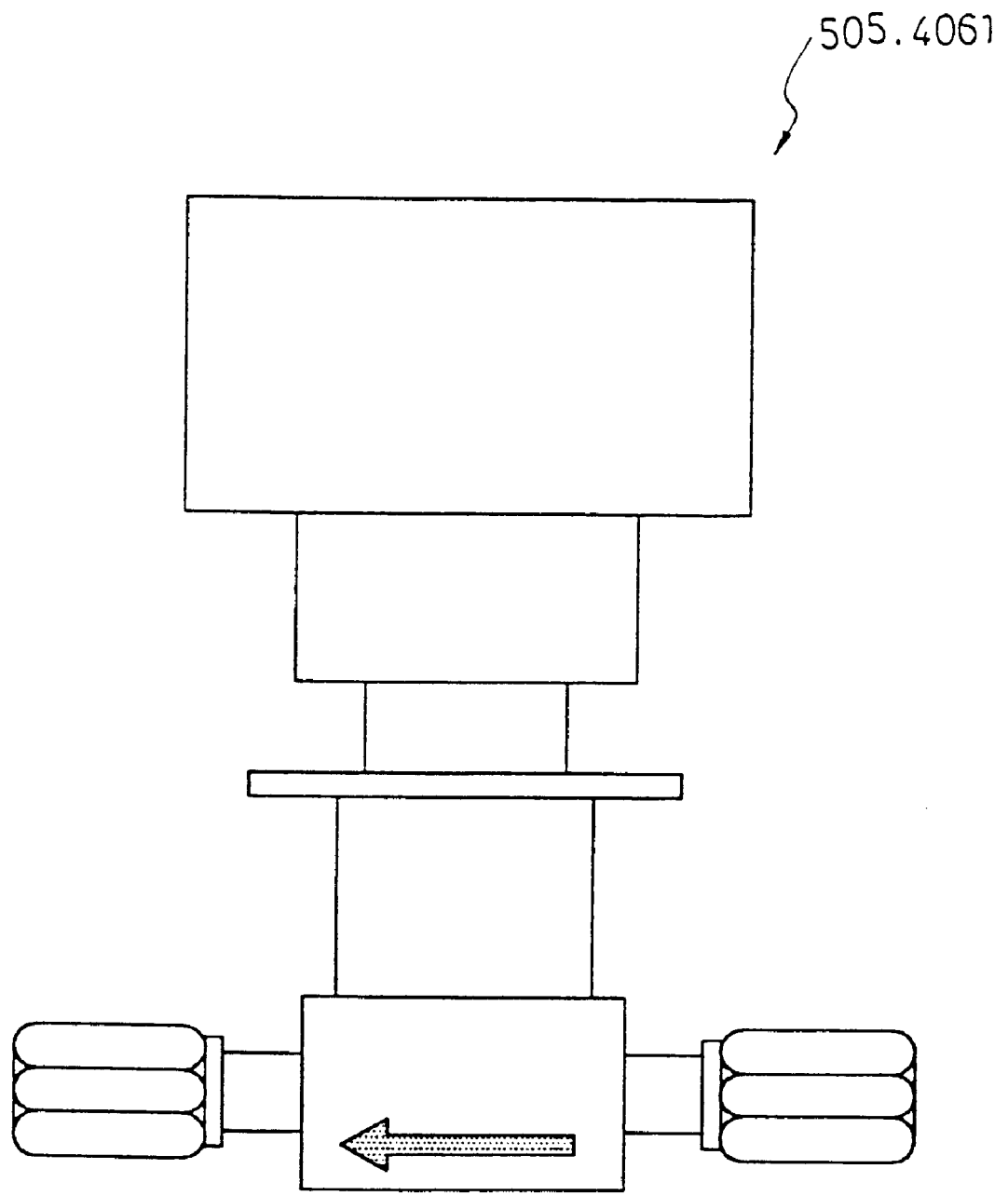
FIG. 11 is a schematic view of the blowing valve and the pneumatic valve.
Figure 12:
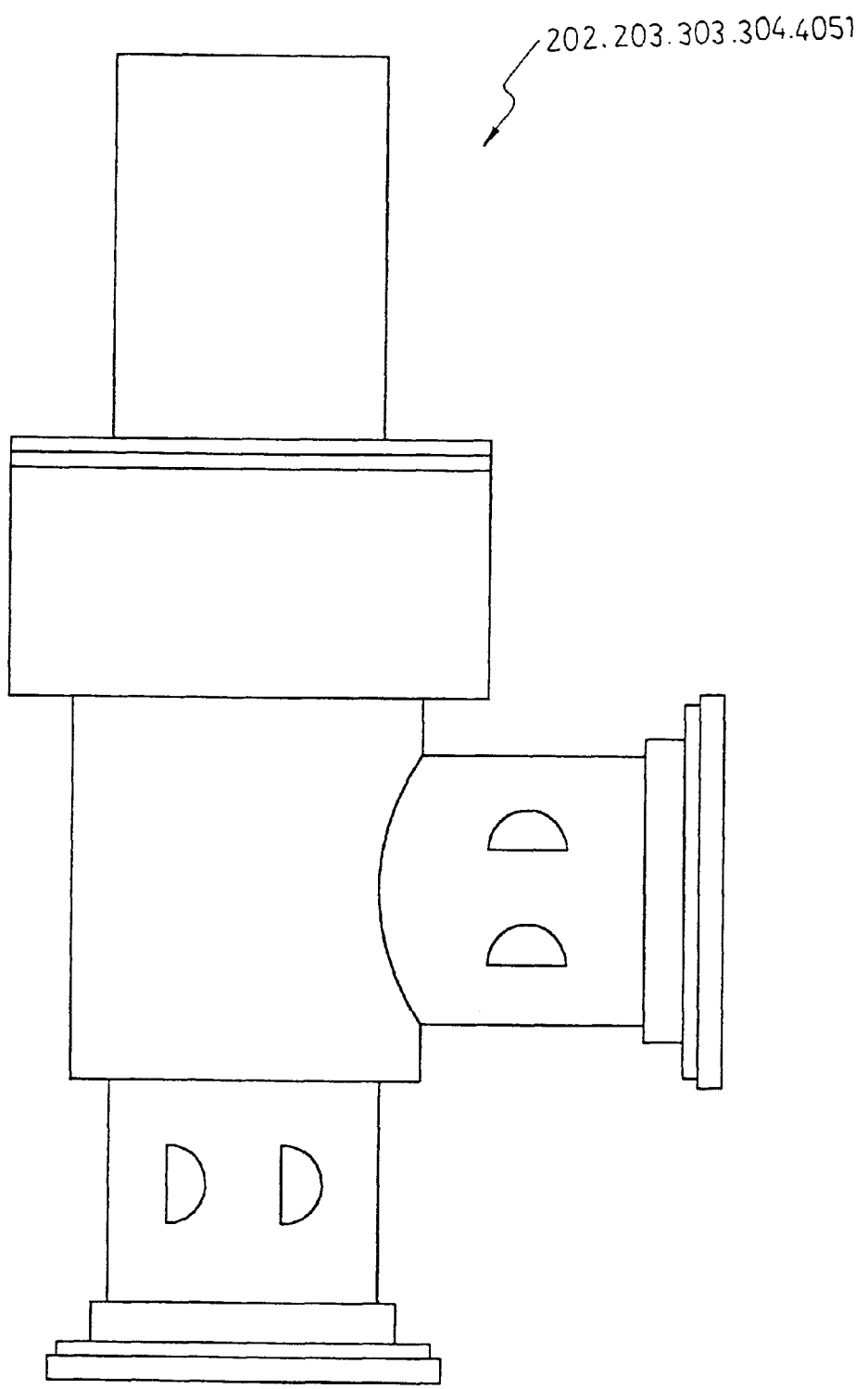
FIG. 12 illustrates the structure of the normal open valve, normal closed valves and control valve for the vacuum degree meter.
Figure 13:
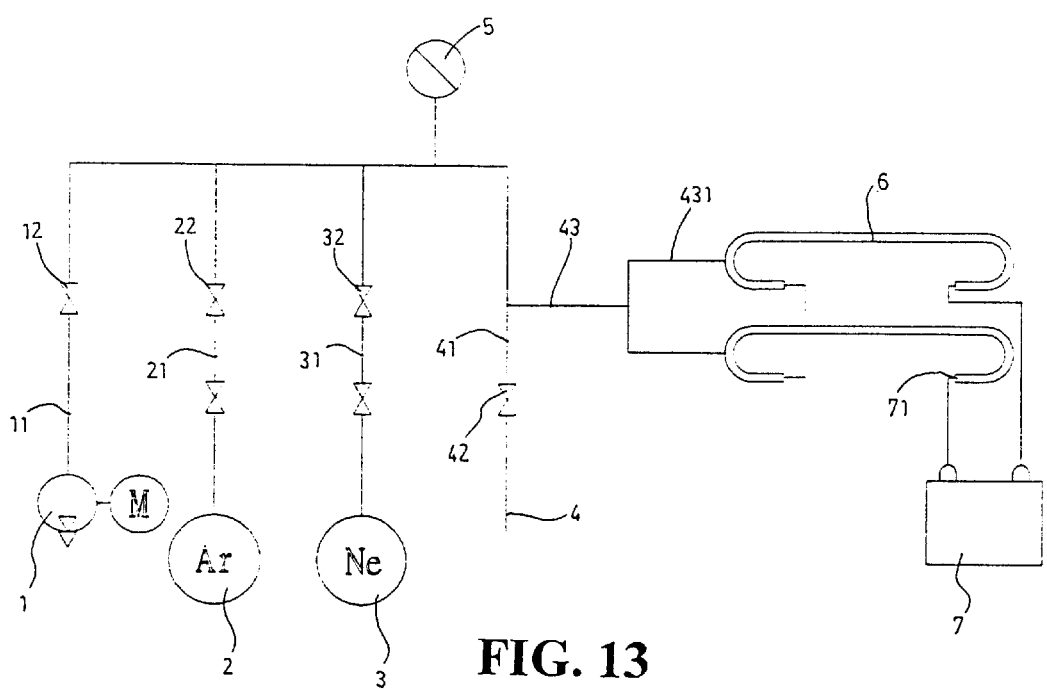
FIG. 13 illustrates a prior art neon light manufacturing equipments.
Figure 14:
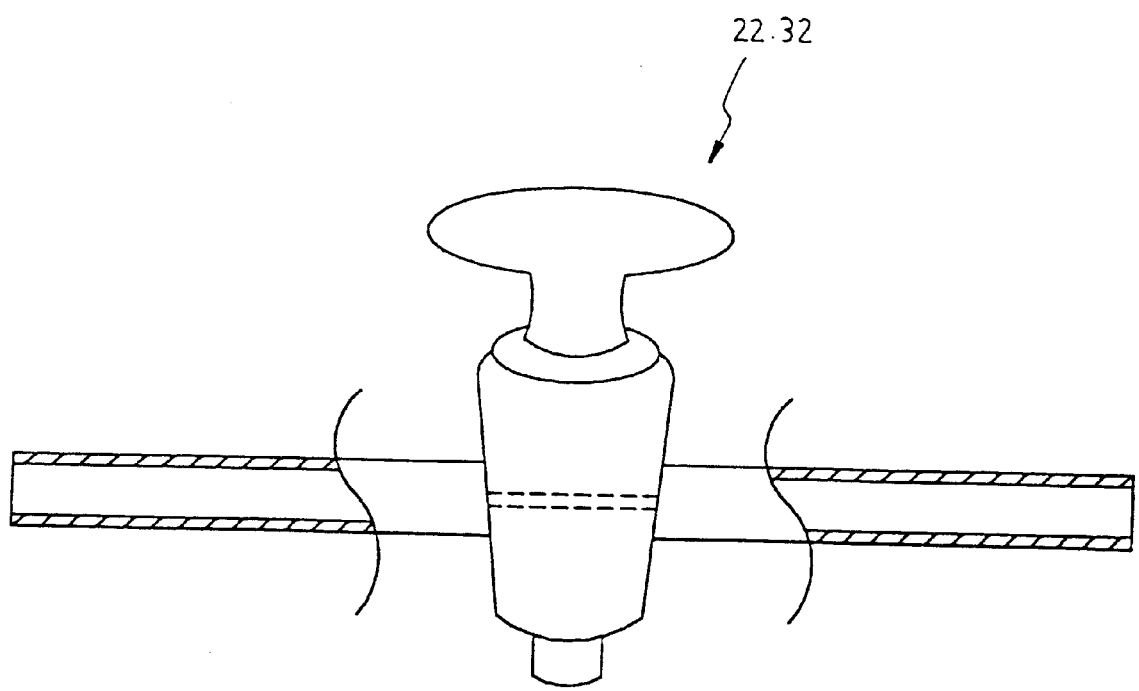
FIG. 14 illustrates a prior art manual valve made of glass.
Figure 15:
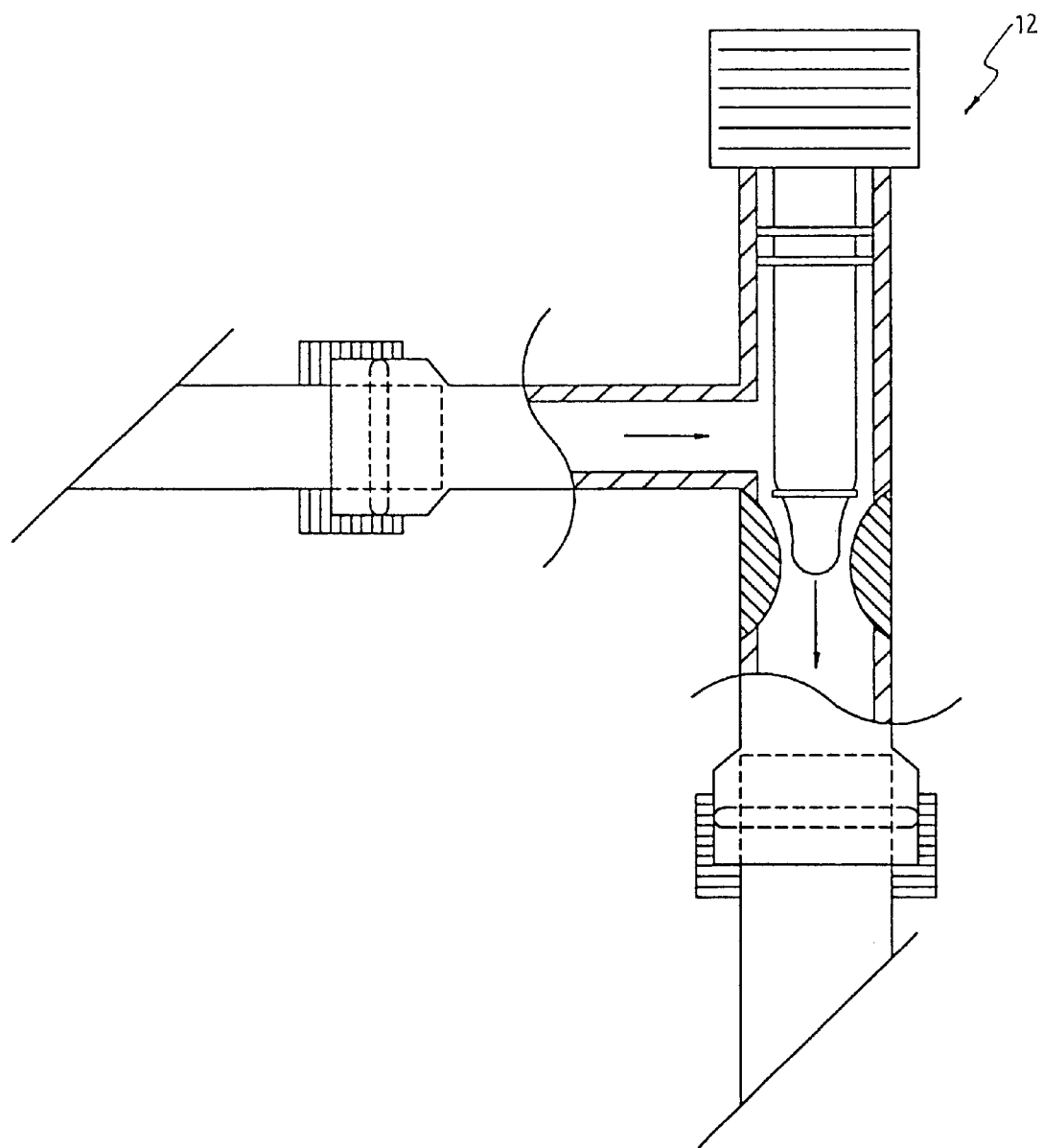
FIG. 15 illustrates a prior art main valve made of glass.

In addition to the above-mentioned features, the present invention still has the following the characteristics:

1. The present invention has a safety sensor 105 on the body frame 10, so that when someone is closed to the platform 102 in operation, the high voltage power will be cut off to ensure one's safety.
2. The major characteristic of the present invention resides in the fully automatic operation for increasing vacuum degree and quality thereby enabling neon tubes (a) of various diameters from 5 mm to 25 mm to be processed. The control panel 101 is provided with two manual switches 1017 and 1018, two knobs 903 and 904, and a timer 905, wherein the manual switch 1017 is used for the switching of 10 kv or 20 kv, the manual switch 1018 is used for providing current for neon tubes with a diameter above 18 mm, the knob 903 is used for controlling the first stage of current, and the knob 904 is used for controlling the second stage of current. If a neon tube (a) with a diameter above 18 mm, the switch 1017 is switched to 20 kv, and the knobs 903 and 904 and the timer 905 are used to adjust the current and required time of the current control 901 according to diameters of 18 mm, 20 mm or 25 mm of neon tubes thereby providing an appropriate heating temperature for the neon tube (a). However, if the neon tube has a diameter below 18 mm, the switch 1017 is switched to 10 kv and the switch 1018, the knob 904 and the timer 905 need not be adjusted.
3. Maintenance is one of the design points of the present invention. The present invention has a turbine timer 1019 on the control panel 101 so that it will remind the operator of maintenance.
4. The control panel 101 is provided with an additional electrical socket 105 and switch 106 for the addition of other functions.
5. The gas tank 50 may be made of steel and may have a capacity of 500 L, so that it can be used for 5–10 years without opening the tank. The commonly used gas tank is made of glass and has a capacity of 1.5 L so that it can be used for 1 month only. The output gas pressure of the gas tank made of steel is about 100 mkg and so two pressure gauges must be provided for making the output gas pressure to be about 6 kg. 6. The gas tank and pneumatic members of the conventional neon tube vacuum processing apparatus made in Europe and the United States are generally made of high class glass with boron silicon glass. However, the component parts are made of different materials, so that they cannot be directly joined together (e.g. boron silicon glass cannot be joined with lead glass) and rapid connector must be used for the connection thereby making the structure more complicated and often having leakage. The component parts of the present invention is basically made of metal thereby making them easily to be joined together.
7. The present invention may be provided with heating cloth and heating wire for increasing vacuum degree.
8. The valves and solenoid valves of the present invention can adopt elements specially designed for vacuum processing (see FIGS. 11 and 12) which are different from the commonly used valve and solenoid.
9. The whole fully automatic control system of the present invention can be controlled by PLC (programmable controller).+

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A multi-functional vacuum processing apparatus for manufacturing neon tubes, glass containers, food containers and cosmetic containers, comprising:
   a rectangular body frame for receiving primary components, said body frame having a control panel on, a platform extending from a rear portion of said body frame for placing workpieces to be processed, a transformer having an output electrode line extending through said body frame to be connected in series with a workpiece to be processed;
   a vacuum pump having an exhaust pipe which is connected at the intermediate portion and an end thereof with normal open valve and normal closed valve;
   a turbine vacuum pump connected with two exhaust pipes having an end connected with exhaust pipes connected with the front and rear sides of the normal open valve, said two exhaust pipes each having a normal closed valve;
   a main pipe having an end connected with a normal closed valve and an intermediate portion connected with an argon pipe, a helium pipe, a neon pipe, a sensor pipe, a vacuum meter pipe and a blowing pipe and having branch pipes at another end connected with a workpiece to be processed;
   gas tanks including an argon tank, a helium gas and neon tank which are connected with pressure gauges, pneumatic valves, gas micro-adjustable valves and switches which are in turn connected to pipes;
   a vacuum degree meter having two hot cathode vacuum sensors and a cold cathode vacuum sensor;
   a turbine controller connected with said vacuum degree meter and said turbine vacuum pump;
   a thermometer for measuring temperature of a workpiece to be processed;
   a high voltage transformer that connects to an end of a neon tube and an adjustable current controller, wherein said transformer produces voltage at an output end from which an electrical wire extends out, said current controller utilizing a knob and a timer to adjust current and set output time; and
   an air compressor arranged within said body frame;
   whereby one can carry out vacuum processing procedures with fully or semi-automatic operations so that no skilful operators are required and ordinary operators can increase quality, working efficiency, service life and production rate, and decrease costs, and can provide protection, safety, troubleshooting and inspection functions.

2. The multi-functional vacuum processing apparatus as claimed in claim 1, wherein said transformer has an output electrode line which extends out of a rear portion of said body frame and is protected and insulated by fixed connectors and then goes through said platform to connect in series with the end of the neon tube.

3. The multi-functional vacuum processing apparatus as claimed in claim 1, wherein said compressor is provided at the bottom with a drain valve under which there is a tray, and said control panel has a drain switch for controlling said drain valve thereby causing water to drop down from said gas tanks into said tray.

4. The multi-functional vacuum processing apparatus as claimed in claim 1, wherein a sensor clamp extends from said body frame to engage with said thermometer at an end and with a workpiece to be processed at another end.

5. The multi-functional vacuum processing apparatus as claimed in claim 1, wherein said control panel include at least one of a temperature sensor clamp indicator light, leakage indicator light, buzzer, and finish indicator light.

6. The multi-functional vacuum processing apparatus as claimed in claim 1, wherein control panel include at least one of a milli-ampere meter, and ampere meter, and thermometer.

7. The multi-functional vacuum processing apparatus as claimed in claim 1, wherein said control panel include at least one of a turbine timer, production counter and timer for filling argon and neon pipes.

8. The multi-functional vacuum processing apparatus as claimed in claim 1, wherein said control panel is provided with reserved electrical sockets and switches for future use.

9. The multi-functional vacuum processing apparatus as claimed in claim 1, wherein said control panel includes a plurality of fully and semi-automatic control switches.

10. The multi-functional vacuum processing apparatus as claimed in claim 1, wherein said control panel has a testing light switch for electrical test of a workpiece to be processed, said testing light switch is connected in parallel with 12 kv transformer which is provided with a relay for cutting off high voltage power.

11. The multi-functional vacuum processing apparatus as claimed in claim 1, wherein said body frame has safety electric sensors.

12. The multi-functional vacuum processing apparatus as claimed in claim 1, wherein said gas tanks are made from steel and provided with two pressure gauges at the outlet.

13. The multi-functional vacuum processing apparatus as claimed in claim 1, wherein said components of vacuuming system are provided with heating cloth and heating filament.

14. The multi-functional vacuum processing apparatus as claimed in claim 1, wherein said workpiece to be processed is a neon tube.

15. The multi-functional vacuum processing apparatus as claimed in claim 1, wherein said vacuum pump is provided with a handle for operation.

16. The multi-functional vacuum processing apparatus as claimed in claim 1, wherein a trash collector is provided at an entrance of a neon tube to be processed and includes a large container and a small container having an end fitted in said large container and another end connected with a connecting pipe, said large container being closed and connected at one side with said main pipe and a filter being provided at the connection.

17. The multi-functional vacuum processing apparatus as claimed in claimed 16, wherein said large container is provided with a clip which can be removed to open said large container for cleaning.

* * * * *